United States Patent [19]

Chen et al.

[11] Patent Number: 5,658,833

[45] Date of Patent: Aug. 19, 1997

[54] METHOD AND DUMMY DISC FOR UNIFORMLY DEPOSITING SILICON NITRIDE

[75] Inventors: Shih-Ching Chen, Nantou Hsien; Edward Houn, Tainan, both of Taiwan

[73] Assignee: United Microelectronics Corporation, Taipei, Taiwan

[21] Appl. No.: 593,919

[22] Filed: Jan. 30, 1996

[51] Int. Cl.$^6$ ................................................. H01L 21/318
[52] U.S. Cl. ................................................ 438/791; 118/724
[58] Field of Search ...................................... 437/241, 225, 437/235, 238; 118/724

[56] References Cited

U.S. PATENT DOCUMENTS

| | | | |
|---|---|---|---|
| 4,279,947 | 7/1981 | Goldman et al. | 427/255.2 |
| 4,350,578 | 9/1982 | Frieser et al. | 204/192 R |
| 4,597,989 | 7/1986 | Wonsowicz et al. | 427/99 |
| 4,653,650 | 3/1987 | Schülke | 211/41 |
| 4,800,100 | 1/1989 | Herbots et al. | 427/38 |
| 5,429,498 | 7/1995 | Okase et al. | 432/152 |
| 5,478,397 | 12/1995 | Shibata et al. | 118/724 |
| 5,500,388 | 3/1996 | Niino et al. | 437/89 |
| 5,516,283 | 5/1996 | Schrems | 432/241 |

FOREIGN PATENT DOCUMENTS

| | | | |
|---|---|---|---|
| 04061331 | 2/1992 | Japan | H01L 21/31 |
| 05190502 | 7/1993 | Japan | H01L 21/302 |

OTHER PUBLICATIONS

Wolf, Stanley and Richard Tauber, Silicon Processing for the VLSI Era, vol. 1, pp. 27, 191–194 (1986).

*Primary Examiner*—Charles L. Bowers, Jr.
*Assistant Examiner*—Matthew Whipple
*Attorney, Agent, or Firm*—Cushman Darby & Cushman IP Group of Pillsbury Madison & Sutro, LLP

[57] ABSTRACT

In a process of fabricating an integrated circuit, a method for uniformly depositing silicon nitride by disposing a plurality of dummy discs beside the production wafers. The dummy discs are made of quartz or silicon carbide. Since the dummy discs can be used longer before been recycled, plenty dummy discs can be saved from disuse. Furthermore, the cost of the management and treatment of the dummy discs is great reduced in this way.

5 Claims, 3 Drawing Sheets

METHOD AND DUMMY DISC FOR UNIFORMLY DEPOSITING SILICON NITRIDE

BACKGROUND OF THE INVENTION

1. Field of Invention

The present invention relates in general to a nitride deposition process carried out during integrated circuit production. More specifically, the invention pertains to a low-pressure chemical vapor deposition (LPCVD) nitride deposition process.

2. Description of Related Art

Silicon nitride deposition is frequently used in the process of manufacturing an integrated circuit. A conventional LPCVD silicon nitride deposition is shown schematically in FIG. 1 (Prior Art). Each set of twenty-five silicon wafers 10 is disposed on a quartz boat 12. Boat 12 is well known by those skilled in the art and is therefore not shown in detail in FIG. 1. A paddle 14 carries seven boats 12 into a quartz furnace 16. Dichlorosilane ($SiCl_2H_2$) gas is sent into the furnace 16 via a gas inlet 18. Ammonia ($NH_3$) gas is sent into the furnace 16 via a gas inlet 19. An exit 15 of furnace 16 is connected to a vacuum pump. The chemical reaction of silicon nitride deposition is:

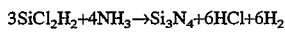

$$3SiCl_2H_2 + 4NH_3 \rightarrow Si_3N_4 + 6HCl + 6H_2$$

Usually, the temperature of furnace 16 is set to about 300° C. when idling. When silicon nitride deposition begins, the temperature is rampaged up to about 780° C.

In the conventional LPCVD process, the silicon wafers disposed on the first and the last boats 12 carried by paddle 14 are dummy wafers 10'. Production wafers 10 are disposed on the other five boats 12 between the first and the last boats. The purpose of using dummy wafers is to increase the uniformity of the thickness of the silicon nitride film on the production wafers which are close to the front end or the rear end.

The dummy wafers can be re-used. However, as known by those skilled in the art, usually the dummy wafers can be re-used only four times, then they must be returned and processed for further use. This is due to the fact that there is also silicon nitride deposited on the dummy wafers. The maximum allowable thickness of the silicon nitride film deposited on the dummy wafers is 0.9 μm because the silicon nitride film may peel off when its thickness is larger than 0.9 μm. If too much silicon nitride film peels off, the furnace and the production wafers will be contaminated seriously, then the furnace must be rampaged down to be cleaned. As a result the down time will increase greatly, and the efficiency of production will be greatly affected.

Furthermore, fifty (50) dummy wafers are used in one LPCVD silicon nitride process. Therefore plenty of dummy wafers must be prepared for use, even when they can be recycled after treatment. As a result, the cost of the management and treatment of the dummy wafers is great.

SUMMARY OF THE INVENTION

It is therefore an object of the present invention to provide a method for uniform deposition of silicon nitride film and dummy discs for the method. In the present invention, we do not use a conventional dummy wafer of silicon, as in the prior art. Rather, we use a "dummy disc" made of quartz or silicon carbide (SiC). The peeling of silicon nitride from quartz or SiC dummy discs is less than from conventional silicon dummy wafers. Therefore, the quartz or SiC dummy discs can be recycled after being used about twenty times. Many dummy discs can be saved from disuse using the technique according to the present invention. Furthermore, the cost of the management and treatment of the dummy discs is greatly reduced with respect to previously known fabrication techniques.

The object of the present invention is fulfilled by providing a method for uniformly depositing silicon nitride in a process of fabricating an integrated circuit. The method comprises the following steps:

disposing a plurality of production wafers on a paddle;

disposing a plurality of dummy discs beside the production wafers, the dummy discs being made of quartz, each the dummy disc having at least one hole; and depositing silicon nitride on the production wafers in a furnace.

BRIEF DESCRIPTION OF THE DRAWINGS

The present invention will be more fully understood from the detailed description given hereinafter with reference to the accompanying drawings which are given by way of illustration only, and thus do not limit the present invention, and wherein.

DETAILED DESCRIPTION OF THE PREFERRED EMBODIMENT

Figure 1:
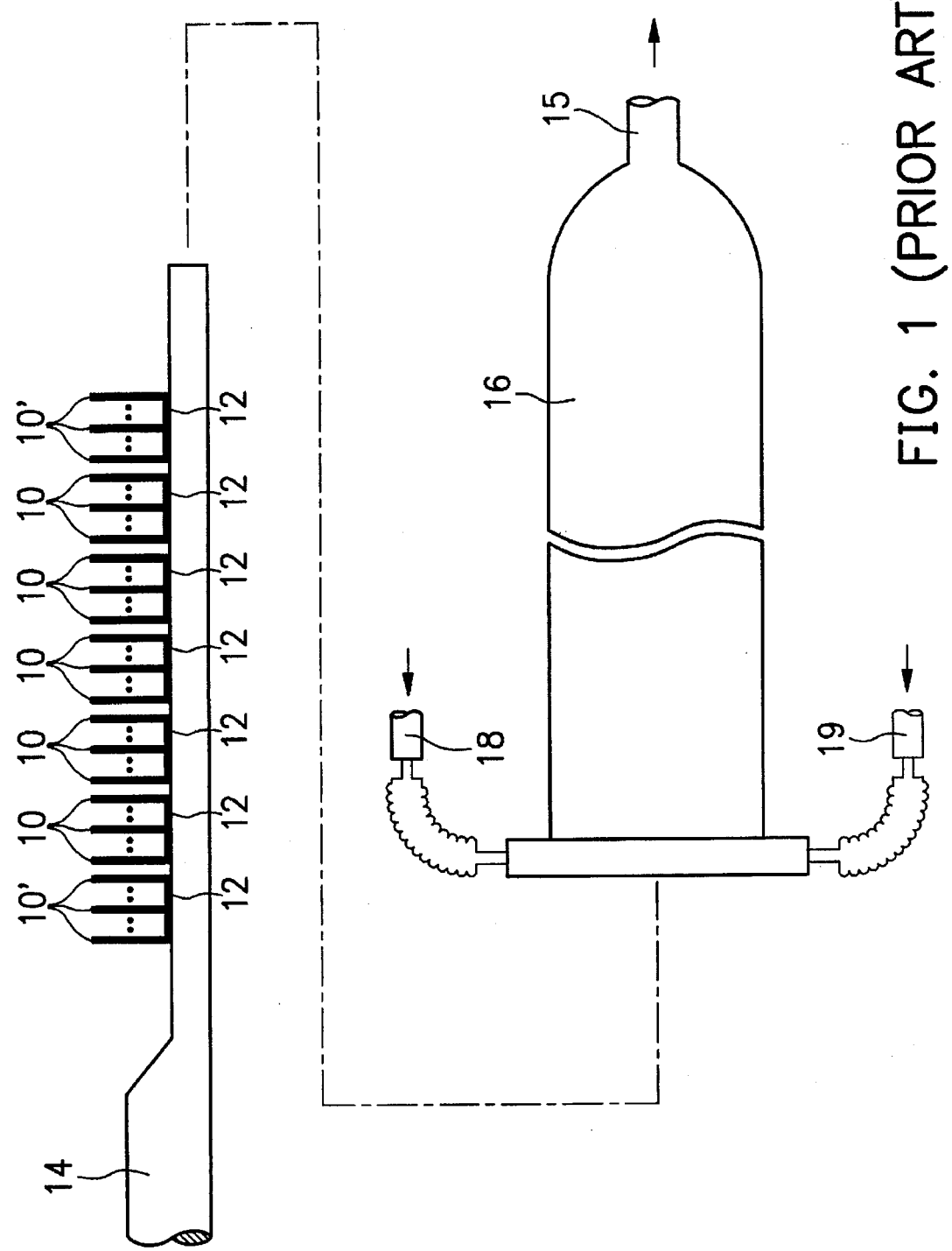
FIG. 1 (Prior Art) is a schematic diagram of conventional LPCVD silicon nitride deposition process.
Figure 2:
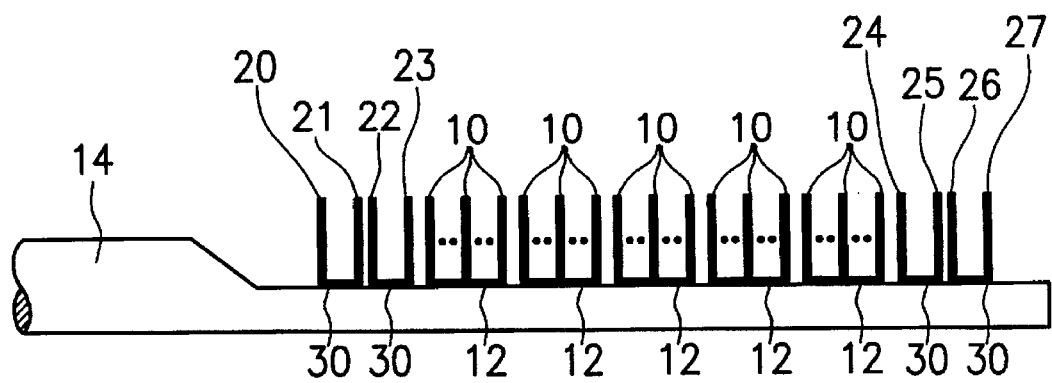
FIG. 2 shows a preferred embodiment of the present invention in which four dummy discs are disposed at both the front end and the rear end of the paddle.

FIG. 2 shows a preferred embodiment of the present invention in which four dummy discs are disposed at both the front end and the rear end of the paddle. This is a presently preferred arrangement for carrying out uniform deposition of silicon nitride film according to the present invention. A paddle 14 carries five boats 12. Each boat 12 carries twenty five production wafers 10. They are designated by the same numerals used for corresponding elements in FIG. 1.

The preferred embodiment of the present invention is different from the conventional method because the conventional dummy wafers are not used to improve the thickness uniformity of the silicon nitride deposition at the front and rear ends. Dummy discs 20 to 27 according to the present invention are disposed at the front and rear ends of the five boats 12. Dummy discs 20 to 27 could be made of quartz or SiC, since silicon nitride is not easy to peel off quartz or SiC. Therefore, the dummy discs 20 to 27 can be used twenty times before being recycled, much longer than the conventional "dummy wafers" of the prior art.

Figure 3A:
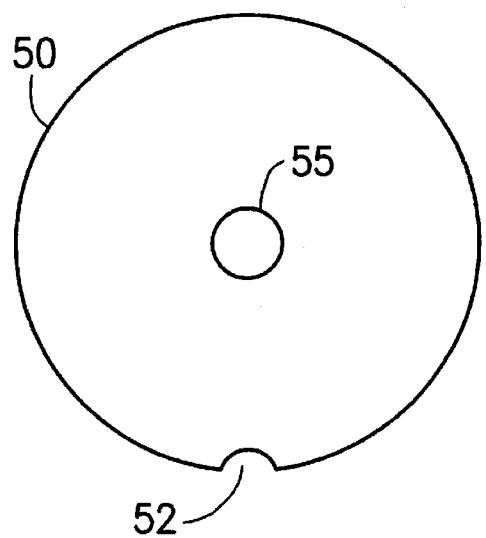
FIGS. 3a to 3c show three kinds of the dummy discs shown in FIG. 2.
Figure 3B:
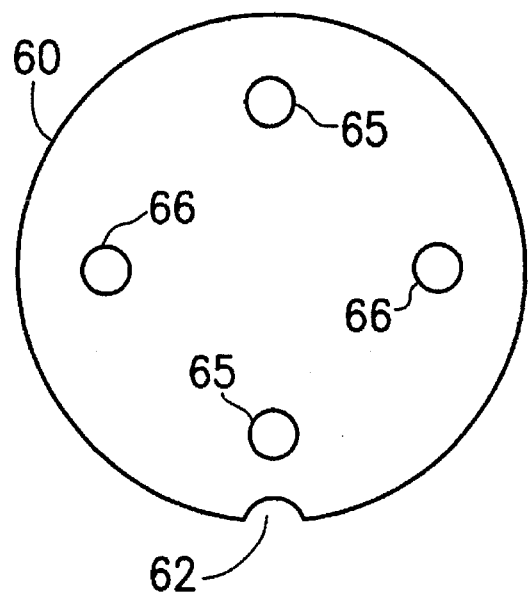
Figure 3C:
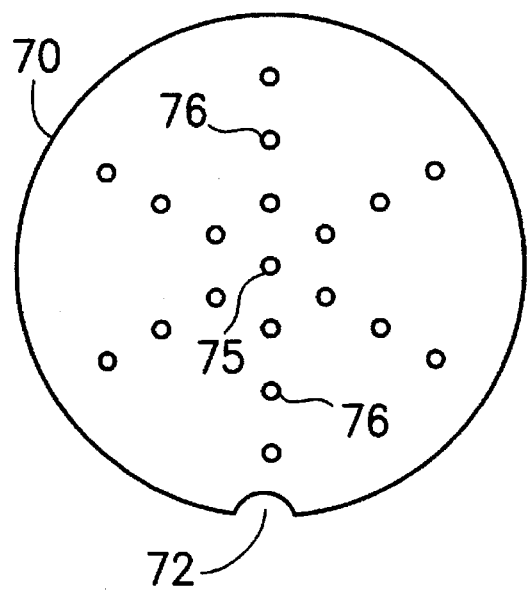

Dummy disc arrangements are shown in FIGS. 3a, 3b, and 3c. They are designated by reference numerals 50, 60, and 70, respectively. The structures 50, 60, and 70 are substantially round, each having an arc-like notch 52, 62, and 72, respectively, for orienting the dummy discs. The diameter of the dummy discs is about 174 mm. The thickness of the dummy discs is about 3.0 mm. The radius of the arc-like notch is about 12.7 mm.

The dummy disc structure 50, shown in FIG. 3a, has a central hole 55 with a diameter of 25.4 mm. The dummy disc structure 60, shown in FIG. 3b, has two holes 65 symmetrically disposed along the radius direction across the arc-like notch 62, with a diameter of 12.7 mm and a distance to the center of the structure of 59.5 mm. Two holes 66 with the same diameter of the holes 65 are similarly disposed in the orthogonal direction. The dummy disc structure 70, shown in FIG. 3c, has a hole 75 at its center, and three pairs of holes 76 symmetrically disposed along the radius direction across the arc-like notch 72. Three pairs of holes are similarly disposed in a direction tilted 60° counterclockwise. Another three pairs of holes are similarly disposed at a direction tilted 60° clockwise. There are 19 holes disposed on the structure 70 with the same diameter 5.91 mm. The number of holes and the dimensions are not limited to those stated above and the invention is not be limited to the disclosed embodiment.

In FIG. 2, the outer dummy discs 20 and 27 are of the structure 50, shown in FIG. 3a, with a single hole. The dummy discs 21, 22, 25, and 26, and at the inner side of the dummy discs 20 and 27 are of the structure 60, shown in FIG. 3b, with four holes. The inner dummy discs 23 and 24 are of the structure 70, shown in FIG. 3c, with 19 holes. Each two dummy discs are disposed on one dummy disc boat 30 and carried on paddle 14. The notch should face down to ensure its orientation. The dummy disc boat 30 may be of any appropriate structure. Since it is not directly related to the present invention, its structure is not shown in detail.

The dummy discs are arranged on the paddle 14 according to the following principles:

The number of the holes on the dummy discs increases and the diameter of the holes decreases from the outer side to the inner side.

The holes of adjacent dummy discs should not be placed in line so that the reacting gas will not directly pass through two dummy discs.

The purpose of the two principles is that in the deposition of silicon nitride, dummy disc 20 to 27 will force the reacting gas ($SiCl_2H_2$ and $NH_3$) to flow through the furnace 16 uniformly, so that the uniformity of silicon nitride deposition will not be deteriorated. For example, the uniformity of silicon nitride film may be within 3%. Furthermore, the reacting gas will not directly rush the production wafer in this kind of arrangement, so as to avoid the contamination of particles in the reacting gas.

Within the spirit of the present invention, the number of holes and the dimensions are not limited to those stated above and the invention is not be limited to the disclosed embodiment. Any appropriate arrangements and similar modifications of structures are intended to be covered in the scope of the present invention. Experiments of silicon nitride deposition for various arrangements of dummy discs are described hereinafter.

In the experiments stated below, from left to right as shown in FIG. 2, five boats are numbered from B1 to B5, and the wafers are numbered from #1 to #25. In the tables listed below, up, center, down, left, and right represent corresponding relative positions of the wafers when the flat notches of the production wafers face down. The unit of the thickness of the deposited silicon nitride film is angstroms. W/I-U represents within wafer uniformity. W/W-U represents wafer to wafer uniformity.

EXPERIMENT 1

As shown in FIG. 2, the arrangement of dummy discs and production wafers from right to left: one dummy disc with one hole, one dummy disc with 19 holes, five boats each carrying 25 production wafers, one dummy disc with 19 holes, two dummy discs with four holes, and one dummy disc with one hole. Two dummy discs at the front end. Four dummy discs at the rear end. The result is listed below in table 1:

TABLE 1

| Wafer | Up | Center | Down | Left | Right | Mean | W/I-U | W/W-U |
| --- | --- | --- | --- | --- | --- | --- | --- | --- |
| B5#1 | 1024 | 1002.7 | 1026 | 1041.4 | 1037.8 | 1026.4 | 1.9% | 1.7% |
| B5#2 | 1031 | 1049 | 1043 | 1010 | 1046 | 1035.8 | 1.9% | |
| B5#3 | 1049 | 1034 | 1051 | 1052 | 1016 | 1040.4 | 1.7% | |
| B1#23 | 1045 | 1035.6 | 1059 | 1061 | 1011 | 1042.3 | 2.4% | |
| B1#24 | 1035 | 1005 | 1059 | 1060 | 1046 | 1041.0 | 2.6% | |
| B1#25 | 1049 | 1044 | 1080.5 | 1072 | 1065.6 | 1062.2 | 1.7% | |

EXPERIMENT 2

As shown in FIG. 2, the arrangement of dummy discs and production wafers from right to left: one dummy disc with one hole, one dummy disc with 19 holes, five boats each carrying 25 production wafers, one dummy disc with one hole, two dummy discs with four holes, and one dummy disc with 19 holes. Two dummy discs at the front end. Four dummy discs at the rear end. The result is listed below in table 2:

TABLE 2

| Wafer | Up | Center | Down | Left | Right | Mean | W/I-U | W/W-U |
| --- | --- | --- | --- | --- | --- | --- | --- | --- |
| B5#1 | 1021 | 994.5 | 1028.4 | 1041.4 | 1037.5 | 1024.6 | 2.3% | 1.7% |
| B5#2 | 1029 | 1005.9 | 1045.4 | 1050.7 | 1046 | 1035.4 | 2.2% | |
| B5#3 | 1024.3 | 1011.9 | 1051 | 1053.5 | 1047.6 | 1037.7 | 2.0% | |
| B1#23 | 1059 | 1022.4 | 1066.6 | 1084 | 1055.7 | 1057.6 | 2.9% | |
| B1#24 | 1037 | 1003.2 | 1059.8 | 1063 | 1038 | 1040.2 | 2.9% | |
| B1#25 | 1046 | 1047.6 | 1078.8 | 1073.5 | 1057.5 | 1060.7 | 1.5% | |

EXPERIMENT 3

As shown in FIG. 2, the arrangement of dummy discs and production wafers from right to left: one dummy disc with one hole, one dummy disc with 19 holes, five boats each carrying 25 production wafers, one dummy disc with 19 holes, and two dummy discs with four holes. Two dummy discs at the front end. Three dummy discs at the rear end. The result is listed below in table 3:

TABLE 3

| Wafer | Up | Center | Down | Left | Right | Mean | W/I-U | W/W-U |
|---|---|---|---|---|---|---|---|---|
| B5#1 | 1029 | 1001.6 | 1043.7 | 1075.9 | 1034.9 | 1037.0 | 3.6% | 2.3% |
| B5#2 | 1060.4 | 1030 | 1080 | 1106.6 | 1063.3 | 1068.1 | 3.6% | |
| B5#3 | 1076.5 | 1050.7 | 1100.6 | 1123 | 1079.4 | 1086.0 | 3.3% | |
| B1#23 | 1065 | 1032.2 | 1076.5 | 1097.6 | 1057.5 | 1065.8 | 3.1% | |
| B1#24 | 1065 | 1025 | 1076.5 | 1097 | 1058 | 1064.3 | 3.4% | |
| B1#25 | 1077.7 | 1066 | 1098 | 1107.8 | 1078.8 | 1085.7 | 1.9% | |

From the above three experiments, it is concluded that the uniformity maintains within 3% using five or six dummy discs in different arrangements.

While the invention has been described by way of examples and in terms of several preferred embodiments, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. In a process of fabricating an integrated circuit, a method for uniformly depositing silicon nitride, comprising the following steps of:

disposing a plurality of production wafers in a row having two ends on a paddle;

disposing a plurality of dummy discs at said ends of said row of the dummy discs being made of a material selected from the group of quartz and silicon carbide, each dummy disc having at least one hole therein; and depositing silicon nitride on the production wafers in a furnace.

2. The method as claimed in claim 1, wherein the dummy discs are substantially circles, each dummy disc having an arc-like notch for indicating its orientation.

3. The method as claimed in claim 2, wherein the diameter of the dummy discs is about 174 mm, the thickness of the dummy discs is about 3.0 mm.

4. The method as claimed in claim 3, wherein three structures of the dummy discs are provided, the first structure with a first hole, the second structure with four second holes smaller than the first hole, the third structure with nineteen third holes smaller than the second holes.

5. The method as claimed in claim 4, wherein the holes are not placed in line in the arrangement of the dummy discs.

* * * * *